(12) United States Patent
Knowles et al.

(10) Patent No.: US 7,307,627 B2
(45) Date of Patent: *Dec. 11, 2007

(54) INDIVIDUAL ACOUSTIC WAVE SWITCH

(75) Inventors: Terence J. Knowles, Barrington, IL (US); Charles F. Bremigan, III, Jarrell, TX (US)

(73) Assignee: Illinois Tool Works, Inc., Glenview, IL (US)

( * ) Notice: Subject to any disclaimer, the term of this patent is extended or adjusted under 35 U.S.C. 154(b) by 270 days.

This patent is subject to a terminal disclaimer.

(21) Appl. No.: 10/435,853

(22) Filed: May 12, 2003

(65) Prior Publication Data

US 2004/0227740 A1 Nov. 18, 2004

(51) Int. Cl.
*G09G 5/00* (2006.01)

(52) U.S. Cl. .............. 345/177; 345/169; 345/156; 178/18.04; 310/318; 310/328; 310/333

(58) Field of Classification Search ........ 345/156–169, 345/177; 178/18.04, 19.02; 200/5 A, 6 A, 200/5 R, 5 D; 463/37–38; 310/318, 328, 310/322, 321, 333, 311–313, 313 R, 313 A, 310/367–371
See application file for complete search history.

(56) References Cited

U.S. PATENT DOCUMENTS

| | | | |
|---|---|---|---|
| 4,441,001 A * | 4/1984 | Miyano et al. ............. 200/308 |
| 4,645,870 A | 2/1987 | Adler |
| 4,700,176 A | 10/1987 | Adler |
| 4,945,357 A * | 7/1990 | Tal ............................... 341/20 |
| 5,095,302 A * | 3/1992 | McLean et al. ............. 345/164 |
| 5,149,986 A | 9/1992 | Jalbert |
| 5,162,780 A * | 11/1992 | Solhjell ...................... 345/164 |
| 5,177,327 A | 1/1993 | Knowles |
| 5,296,839 A * | 3/1994 | Lu ............................ 340/384.6 |
| 5,451,723 A | 9/1995 | Huang et al. |
| 5,573,077 A | 11/1996 | Knowles |
| 5,673,041 A * | 9/1997 | Chatigny et al. ............. 341/22 |
| 5,813,280 A | 9/1998 | Johnson et al. |
| 5,856,820 A | 1/1999 | Weigers et al. |
| 5,861,823 A * | 1/1999 | Strauch et al. ................ 341/22 |
| 5,986,224 A | 11/1999 | Kent |
| 6,078,315 A | 6/2000 | Huang |
| 6,085,576 A | 7/2000 | Sunshine et al. |
| 6,087,599 A | 7/2000 | Knowles |
| 6,091,406 A | 7/2000 | Kambara et al. |
| 6,107,722 A * | 8/2000 | Thurn ........................ 310/322 |
| 6,369,806 B1 | 4/2002 | Endo et al. |
| 6,393,921 B1 * | 5/2002 | Grimes et al. ................ 73/728 |
| 6,473,075 B1 | 10/2002 | Gomes et al. |
| 6,492,978 B1 * | 12/2002 | Selig et al. .................. 345/173 |
| 7,026,943 B2 * | 4/2006 | Knowles et al. ............. 340/582 |
| 2002/0126104 A1 * | 9/2002 | Knowles et al. ............. 345/177 |
| 2002/0149570 A1 * | 10/2002 | Knowles et al. ............. 345/173 |
| 2004/0051701 A1 * | 3/2004 | Knowles ...................... 345/177 |

* cited by examiner

*Primary Examiner*—Lun-Yi Lao
(74) *Attorney, Agent, or Firm*—McAndrews, Held & Malloy, Ltd.

(57) ABSTRACT

An individual acoustic wave switch includes a body with a top section having an acoustic wave cavity formed therein and a base section extending downwardly from the top section. An acoustic wave transducer is mounted adjacent to a surface of the acoustic wave cavity opposite the touch surface thereof so as to generate an acoustic wave in the acoustic wave cavity and to pick up a signal representing the acoustic wave energy in the cavity. The acoustic wave switch is readily mounted in an aperture of a substrate through which the base of the switch extends.

33 Claims, 2 Drawing Sheets

INDIVIDUAL ACOUSTIC WAVE SWITCH

CROSS-REFERENCE TO RELATED APPLICATIONS

This application is related to U.S. patent applications Ser. No. 09/998,355 filed Nov. 20, 2001, entitled "Acoustic Wave Touch Actuated Switch" and Ser. No. 10/245,246 filed Sep. 17, 2002, entitled "Acoustic Wave Sensor With EMAT Drive."

STATEMENT REGARDING FEDERALLY SPONSORED RESEARCH OR DEVELOPMENT

N/A

FIELD OF THE INVENTION

The present invention relates to an acoustic wave touch sensor and more particularly to an individual acoustic wave switch.

BACKGROUND OF THE INVENTION

There is a substantial need for finger touch actuated switches that are rugged and explosion proof, operate in the presence of liquids, have low power consumption, withstand aggressive sterilization procedures and are inexpensive. Known switches that attempt to meet these needs but fail include the following. A Qprox switch made by Quantum Research Group senses the presence of touch through a charge transfer effect. This switch is sensitive to conductive fluids and/or an ionizing atmosphere and can be made inoperable thereby. Further, the enclosure through which touch is sensed cannot be made of an electrically conducting material, so that metals and the like cannot be used. Piezoelectric switches such as supplied by Schurter or Wilson-Hurd, operate by transferring finger pressure via a metal overlay to a piezoelectric element which generates a voltage when compressed. This type of switch is expensive compared to a standard membrane switch and shares the disadvantages of membrane switches in that holes in the housing or enclosure are required to accommodate the switch. Further, the metal overlay is necessarily thin, so that the piezoelectric element is relatively unprotected against blows to the overlay. Another type of switch shown in U.S. Pat. No. 5,149,986 is based on the absorption of sound in a glass, ball-shaped button when the button is touched. In operation, a transducer sends sound waves into the glass balls and then receives back the echoes in a sonar type fashion. A circuit analyzes the echoes to determine whether the echoes have been reduced indicating a touch. This type of switch is relatively expensive and again requires openings in the housing or enclosure in which the switch is to be mounted.

An acoustic wave switch such as shown in U.S. Pat. No. 5,673,041 includes an ultrasonic piezoelectric transducer mounted on a surface of a substrate opposite a touch surface of the substrate. The transducer generates an ultrasonic wave that propagates in a direction across the thickness of the substrate to the touch surface and reflects off of the touch surface back to the transducer. The ultrasonic wave appears to be a compressional wave. A touch on the touch surface changes the acoustic reflectivity of the surface and changes the impedance of the transducer. The acoustic energy in this switch is not confined and spreads out into the plane of the substrate. As such, the ratio of the stored energy to lost or dissipated energy over a complete cycle, referred to as the Q of the switch, is inherently low and an extremely complex touch detection circuit is required to discriminate between a touch and the absence of a touch. Moreover, the use of compressional waves in this switch is undesirable due to their sensitivity to liquids and other contaminants which can render the switch inoperable.

Also known are acoustic wave touch panels that employ reflective gratings or arrays to reflect portions of an acoustic wave across a touch surface along parallel paths of differing lengths. These devices use a transparent substrate that can overlay a display to provide a touch screen or the like. Examples of such touch sensors are shown in U.S. Pat. Nos. 4,645,870 and 4,700,176 which utilize surface acoustic waves. These systems are undesirable, however, because surface acoustic waves are sensitive to liquids, sealing compounds and other contaminants that can render the panel inoperable and difficult to seal effectively. Another acoustic wave touch panel using reflective arrays is shown in U.S. Pat. No. 5,177,327. This touch panel uses shear waves and in particular the zeroth order horizontally polarized shear wave. Although this touch position sensor is insensitive to liquids and contaminants, touch position sensors that use reflective gratings or arrays and the associated touch detection circuitry are, in general, too expensive to use for an individual switch or for a small number of switches on a panel. Moreover, because the shear wave transducer in this latter system is mounted on a side of the panel to generate a shear wave that propagates in the plane of the substrate, an opening in the enclosure or housing is required to accommodate the panel. U.S. Pat. No. 5,573,077 also uses zeroth order horizontally polarized shear waves, but instead of reflective gratings, discrete transducers are used to propagate the shear waves along parallel paths extending across the substrate.

BRIEF SUMMARY OF THE INVENTION

In accordance with the present invention, the disadvantages of prior switches as discussed above have been overcome. In accordance with the present invention, an individual acoustic wave switch includes a body having a top surface with an acoustic wave cavity formed therein with a touch surface for actuating the switch. The body also includes a base extending downwardly from the top surface so that the switch can easily be mounted in an aperture of a substrate.

In one embodiment of the present invention, a portion of the base includes a threaded outer surface for retaining the switch in the substrate by means of a nut or the like. Alternatively, the threads of the base can engage a threaded aperture so that an additional retaining member is not required.

In a further embodiment of the present invention, the top surface also includes a flange that extends beyond the base of the switch so as to limit the extent to which the switch can extend into the substrate aperture. Moreover, the flange can be formed with a tapered outer surface so as to make the switch extremely difficult to remove from the touch side of the substrate.

The acoustic wave switch of the present invention is extremely rugged, easy to manufacture and easy to mount in a substrate so that one or many acoustic wave switches may be readily mounted for use.

These and other advantages and novel features of the present invention, as well as details of an illustrated embodiment thereof, will be more fully understood from the following description and drawings.

DETAILED DESCRIPTION OF THE INVENTION

Figure 1:
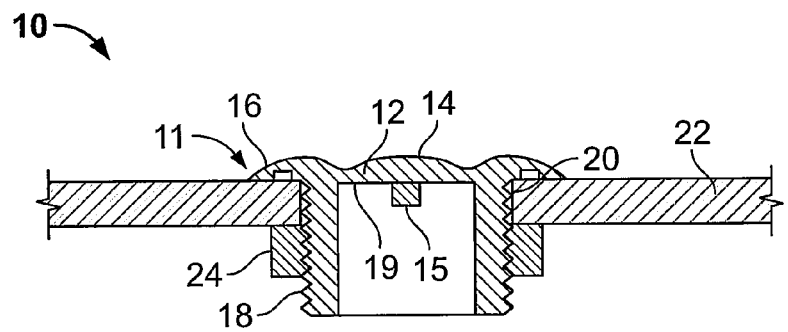
FIG. 1 is a cross-sectional view of one embodiment of the acoustic wave switch of the present invention shown mounted in an aperture of a substrate.

An individual acoustic wave switch 10 in accordance with the present invention, as illustrated in FIG. 1, includes a top section 11 having an acoustic wave cavity 12 formed therein with a touch surface 14 for actuating the switch 10. An acoustic wave transducer 15 is mounted adjacent and directly on a surface of the cavity 12 opposite the touch surface 14. The transducer 15 generates an acoustic wave in the cavity 12. The switch 10 is actuated by an acoustic wave absorber, such as a finger or absorber/damper material, contacting the touch surface 14. More particularly, a touch by an acoustic wave absorber on the touch surface 14 absorbs and/or dampens the acoustic wave in the cavity 12 to produce a detectable change in the signal picked up by the transducer 15, signaling or indicating actuation of the switch 10. The top section 11 also includes a flange 16 that extends beyond a base section 18 of the switch 10. The base section 18 is generally cylindrical and preferably includes a threaded outer surface. The base 18 is also preferably hollow so that electronics for the switch 10 can be mounted therein. The switch 10 as shown in FIG. 1 is mounted in an aperture 20 of the substrate 22 such as a panel, housing wall, etc. and is retained therein by the flange 16 and a nut 24 that is threaded onto the base 18 of the switch 10.

Figure 2:
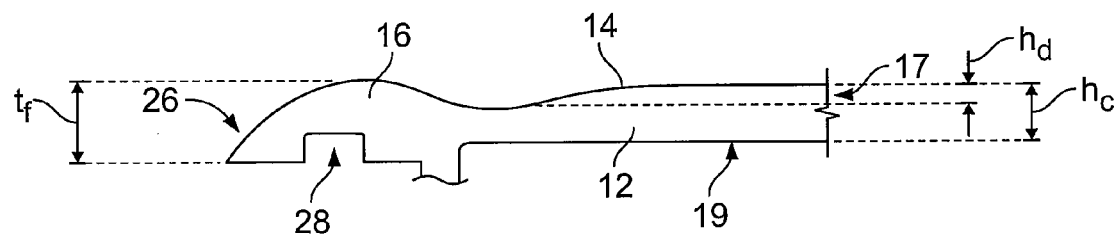
FIG. 2 is an exploded partial cross-sectional view illustrating the height of a dome that defines an acoustic wave cavity of the switch of FIG. 1.

The acoustic wave cavity 12 is defined by a mass differential between the cavity 12 and the immediately adjacent area of the top section 11. In a preferred embodiment, the mass differential is such that the mass per unit surface area of the acoustic wave cavity is greater than the mass per unit surface area of the top section 11 immediately adjacent the acoustic wave cavity. As shown in FIGS. 1 and 2, the mass differential forming the acoustic wave cavity 12 is provided by a slightly raised area and more particularly, a slight dome-shaped area 17, the upper surface of which is the touch surface 14 of the acoustic wave cavity 12. The dome-shaped area defines the acoustic wave cavity 12 which extends from the touch surface 14 through the thickness of the top section of the switch 10 to the opposite surface 19. As shown in FIG. 2, the height of the acoustic wave cavity $h_c$ is on the order of 76 mils, where a mil is 0.001 inch; whereas the height of the top section 11 immediately adjacent the acoustic wave cavity is 56 mils. As such, the dome peak is raised above the area adjacent to the acoustic wave cavity 12 by $h_d$, a difference of only 20 mils. This slight difference in height is sufficient to define an acoustic wave cavity that substantially traps an acoustic wave generated by the transducer 15 in the cavity 12 so that minimal acoustic wave energy is lost through the remainder of the top section of the switch or the base section thereof. Because the acoustic wave energy is trapped, the switch 10 has an extremely high Q.

It is noted, that the raised area defining the acoustic wave cavity 12 may be formed of a shape other than a dome. For example, the raised area may be formed of a thin plateau having a non-circular periphery if desired. Further, the raised area may be formed on the surface 19 opposite the touch surface of the switch 10. In such an embodiment, the touch surface 14 could be flat and the surface on which the transducer 15 is mounted would extend slightly below the adjacent area of the top section 11. Moreover, although the raised area defining the acoustic wave cavity may be integrally formed with the top section 11, the raised area may also be formed of a separate piece of material that is bonded onto the top section 11 of the switch 10. In this embodiment the acoustic wave cavity extends through the separate piece of material and through the area of the top section of the switch underlying or overlying the separate piece of material. Numerous configurations of the raised area defining the acoustic wave cavity are described in U.S. patent application Ser. No. 09/998,355 filed Nov. 20, 2001, entitled "Acoustic Wave Touch Actuated Switch," which patent application is incorporated herein by reference. It should also be noted that the present invention is not limited to acoustic wave cavities formed by a mass differential as discussed above. The acoustic wave cavity may be formed by any known method. Further, the acoustic wave cavity may also extend into the base of the switch 10, but the cavity and substrate 22 should be such that when the switch 10 is mounted in the substrate 22, minimal, if any, acoustic wave energy propagates into the substrate 22 from the switch 10 so that the acoustic wave energy will be substantially trapped in the body of the switch 10.

As noted above, the acoustic wave transducer 15 is capable of generating an acoustic wave in the acoustic wave cavity 12. The acoustic wave switch 10 of the present invention can use any type of acoustic wave. In a preferred embodiment, the acoustic wave generated in the cavity 12 is a shear wave because a shear wave is insensitive to liquids and other contaminants on the touch surface 14 of the switch 10. Because the fundamental or zeroth order mode of a horizontally polarized shear wave cannot be substantially trapped in the cavity 12, higher order shear wave modes are preferably used in accordance with the present invention. It should be appreciated that because the acoustic wave used in accordance with the present invention is trapped, the wave is a standing wave. A standing wave is resonant so that the wave is reinforced and prolonged. As a result, the standing wave has a much greater amplitude than a wave that is not confined in a cavity but propagates into the substrate 22. The preferred shear wave transducer materials are Lead Zirconium, Titanate (PZT) types and more specifically, PZT4D, PZT5A and PZT8 supplied by Morgan Matroc Transducer Products Ltd. These transducers are preferred due to their combination of high coupling factors, low acoustic and electrical losses and impedance levels. However, other types of acoustic wave transducers may be used in accordance with the present invention. Similarly, acoustic waves other than shear waves can be used in accordance with the present invention.

As shown in FIGS. 1 and 2, the thickness $t_f$ of the flange 16 may be greater than the thickness or height $h_c$ of the acoustic wave cavity 12. For example, in the embodiment illustrated, the thickness of the flange is on the order of 125 mils. In this embodiment, the flange 16 has a tapered outer surface 26 so as to make it extremely difficult to remove the switch 10 from the touch surface side of the switch 10. The flange 16 may also include an aperture 28 to accommodate an O-ring or the like so as to seal the switch against the substrate 22.

Figure 3:
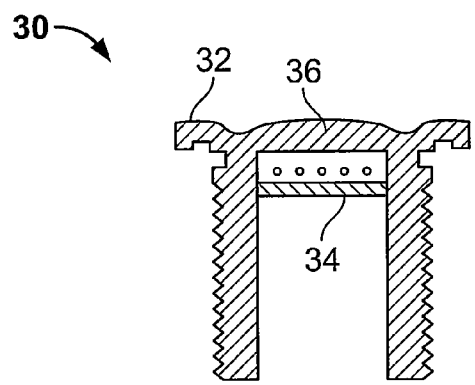
FIG. 3 is a second embodiment of an acoustic wave switch in accordance with the present invention illustrating an EMAT for generating an acoustic wave in the acoustic wave cavity of the switch.

FIG. 3 illustrates another embodiment of an individual acoustic wave switch in accordance with the present invention. The acoustic wave switch 30 of FIG. 3 is similar to that depicted in FIGS. 1 and 2 except that the flange 32 is not tapered. Further, in this embodiment, instead of a transducer 15 that is mounted directly on the acoustic wave cavity as shown in FIG. 1, the acoustic wave transducer of the switch 30 is an electromagnetic acoustic transducer 34, known as an EMAT, that is slightly spaced from the acoustic wave cavity but still adjacent thereto. In this embodiment, at least a portion of the acoustic wave cavity 36 is formed of an electrically conducting material. The EMAT 34 includes a primary coil for generating a resonant acoustic wave in the acoustic wave cavity 36 and a pick-up coil for providing an electrical output signal. In a preferred embodiment, the EMAT also includes a noise canceling coil. Preferably, the primary pick-up and noise canceling coils are concentric although other coil configurations can be used. The details of a suitable EMAT for generating a resonant acoustic wave in the acoustic wave cavity 36 of the switch 30 and for picking up a signal representing the acoustic wave energy in the cavity 36 are shown in U.S. patent application Ser. No. 10/245,246 filed Sep. 17, 2002 and entitled "Acoustic Wave Senor With EMAT Drive," which patent application is incorporated herein by reference. It should be noted, however, that other coil configurations can be used. For example, an EMAT can have only a single coil that functions as both a primary coil and a pick up coil.

Figure 4:
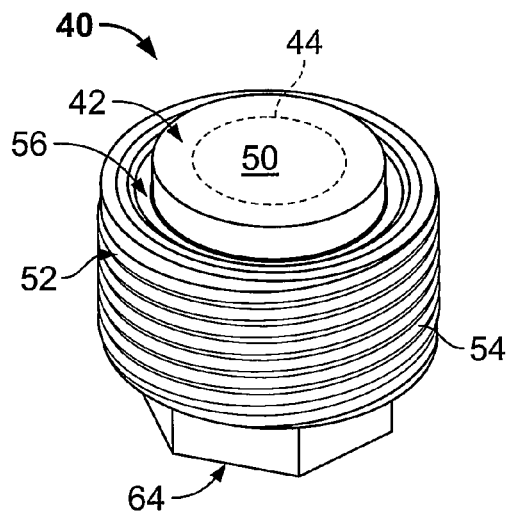
FIG. 4 is a perspective view of still another embodiment of an acoustic wave switch in accordance with the present invention.
Figure 5:
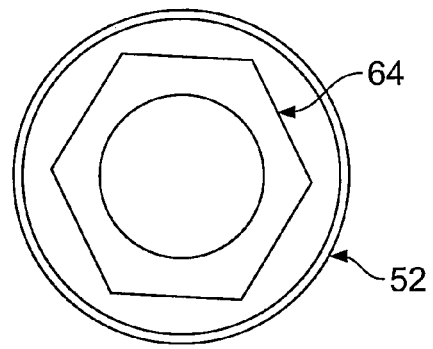
FIG. 5 is a bottom view of the acoustic wave switch of FIG. 4.
Figure 6:
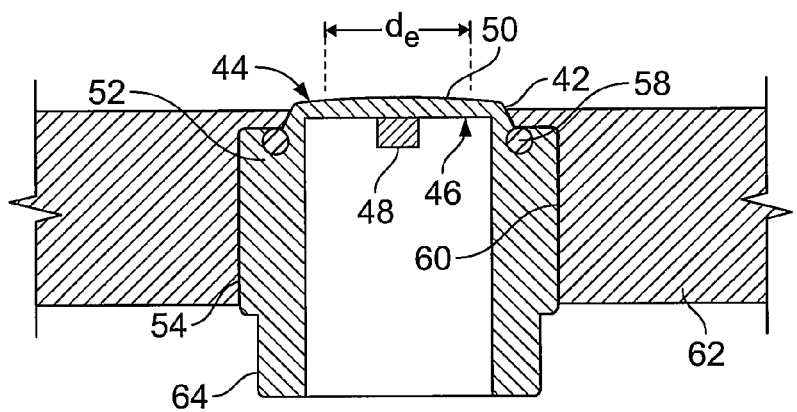
FIG. 6 is a cross-sectional view of the acoustic wave switch of FIG. 4 mounted in an aperture of a substrate.

In another embodiment of the present invention, as shown in FIGS. 4-6, the acoustic wave switch 40 does not include a flange. The top section 42 of the switch includes a slightly domed area 44 with a diameter $d_c$ defining an acoustic wave cavity 46. An acoustic wave transducer 48 is mounted adjacent and directly on a surface of the acoustic wave cavity 46 opposite a touch surface 50 thereof so as to generate an acoustic wave in the acoustic wave cavity 46 and to pick up a signal representing the acoustic wave energy in the cavity. The base 52 of the acoustic wave switch 42 includes a threaded outer surface 54 and an aperture 56 to accommodate an O-ring 58. The switch 40 is preferably mounted in a threaded aperture 60 of a substrate 62 so as to obviate the need for a nut or other retaining member. When mounted, the top section 42 may be generally flush with a top surface of the substrate 62. The base 52 of the switch 40 also includes a hexagonally-shaped portion 64 protruding below the threaded section 54 of the base 52 so that it may be engaged by a wrench or the like to easily mount and/or remove the switch from a threaded substrate aperture 60.

Many modifications and variations of the present invention are possible in light of the above teachings. Thus, it is to be understood that, within the scope of the appended claims, the invention may be practiced otherwise than as described hereinabove.

What is claimed and desired to be secured by Letters Patent is:

1. An acoustic wave switch comprising:
 a body with a top section having an acoustic wave cavity having mass formed therein with a touch surface for actuating the switch, the body having a base section extending downwardly from the top section and the top section having a flange extending beyond the base section; and
 an acoustic wave transducer mounted on the body adjacent a surface of the acoustic wave cavity opposite the touch surface thereof to generate an acoustic wave in the acoustic wave cavity.

2. An acoustic wave switch as recited in claim 1, wherein the base section is hollow and the acoustic wave transducer is mounted in the base section.

3. An acoustic wave switch as recited in claim 1, wherein the acoustic wave transducer is mounted directly on the surface of the acoustic wave cavity opposite the touch surface.

4. An acoustic wave switch as recited in claim 1, wherein the acoustic wave transducer is an electromagnetic acoustic transducer.

5. An acoustic wave switch as recited in claim 1, wherein the acoustic wave cavity includes a centrally located raised area.

6. An acoustic wave switch as recited in claim 1, wherein the acoustic wave cavity includes a dome surface.

7. An acoustic wave switch as recited in claim 6, wherein the flange includes a thickness greater than the peak thickness of the dome.

8. An acoustic wave switch as recited in claim 6, wherein the top surface includes an area of reduced thickness between the dome surface and the flange.

9. An acoustic wave switch comprising:
 a body having a base section with a thread on at least a portion of an outer surface thereof and a top section with a flange extending beyond the base section and an acoustic wave cavity having mass and a touch surface for actuating the switch formed in the top section; and
 an acoustic wave transducer adjacent a surface of the acoustic wave cavity opposite the touch surface, the transducer generating an acoustic wave in the cavity.

10. An acoustic wave switch as recited in claim 9, wherein the acoustic wave transducer is mounted directly on the surface of the acoustic wave cavity opposite the touch surface.

11. An acoustic wave switch as recited in claim 9, wherein the acoustic wave transducer is an electromagnetic acoustic transducer.

12. An acoustic wave switch as recited in claim 9, wherein the acoustic wave cavity includes a centrally located raised area.

13. An acoustic wave switch as recited in claim 9, wherein the acoustic wave cavity includes a dome surface.

14. An acoustic wave switch as recited in claim 13, wherein the flange includes a thickness greater than the peak thickness of the dome.

15. An acoustic wave switch as recited in claim 13, wherein the top surface includes an area of reduced thickness between the dome surface and the flange.

16. An acoustic wave switch as recited in claim 9, wherein the flange is tapered.

17. An acoustic wave switch as recited in claim 9, wherein the base section includes a portion with a hexagonal outer surface, the hexagonal portion being disposed below the threaded portion.

18. An acoustic wave switch comprising:
 a body having a hollow base section with a thread on at least a portion of an outer surface thereof, the hollow base section extending downwardly from a top section with a flange extending beyond the base section and an acoustic wave cavity having mass and a touch surface for actuating the switch being formed in the top section; and an acoustic wave transducer mounted in the hollow base section adjacent a surface of the acoustic wave cavity opposite the touch surface to generate an acoustic wave in the acoustic wave cavity.

19. An acoustic wave switch as recited in claim 18, wherein the acoustic wave transducer is mounted directly on the surface of the acoustic wave cavity opposite the touch surface.

20. An acoustic wave switch as recited in claim 18, wherein the acoustic wave transducer is an electromagnetic acoustic transducer.

21. An acoustic wave switch as recited in claim 18, wherein the acoustic wave cavity includes a centrally located raised area.

22. An acoustic wave switch as recited in claim 18, wherein the acoustic wave cavity includes a dome surface.

23. An acoustic wave switch as recited in claim 22, wherein the flange includes a thickness greater than the peak thickness of the dome.

24. An acoustic wave switch as recited in claim 22, wherein the top surface includes an area of reduced thickness between the dome surface and the flange.

25. An acoustic wave switch as recited in claim 18, wherein the flange is tapered.

26. An acoustic wave switch as recited in claim 18, wherein the base section includes a portion with a hexagonal outer surface, the hexagonal portion being disposed below the threaded portion.

27. An acoustic wave switch as recited in claim 18, wherein the flange includes an aperture therein to accommodate an O-ring.

28. An acoustic wave switch comprising:

a body having a base section with a thread on at least a portion of an outer surface thereof and a top section having an acoustic wave cavity having mass formed therein with a touch surface for actuating the switch; and an acoustic wave transducer adjacent a surface of the acoustic wave cavity opposite the touch surface, the transducer generating an acoustic wave in the cavity.

29. An acoustic wave switch as recited in claim 28, wherein the acoustic wave transducer is mounted directly on the surface of the acoustic wave cavity opposite the touch surface.

30. An acoustic wave switch as recited in claim 28, wherein the acoustic wave transducer is an electromagnetic acoustic transducer.

31. An acoustic wave switch as recited in claim 28, wherein the acoustic wave cavity includes a dome surface.

32. An acoustic wave switch as recited in claim 28, wherein the base section includes a portion with a hexagonal outer surface, the hexagonal portion being disposed below the threaded portion.

33. An acoustic wave switch as recited in claim 28, wherein the base section is hollow and the acoustic wave transducer is mounted in the base section.

* * * * *